United States Patent
Hsueh et al.

(10) Patent No.: US 9,607,121 B2
(45) Date of Patent: Mar. 28, 2017

(54) CASCODE CMOS STRUCTURE

(71) Applicant: Taiwan Semiconductor Manufacturing Co., Ltd., Hsin-Chu (TW)

(72) Inventors: Fu-Lung Hsueh, Kaohsiung (TW); Chih-Ping Chao, Jhudong Town (TW); Chewn-Pu Jou, Hsinchu (TW); Yung-Chow Peng, Hsinchu (TW); Harry-Hak-Lay Chuang, Crescent (SG); Kuo-Tung Sung, Zhudong Town (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/464,730

(22) Filed: Aug. 21, 2014

(65) Prior Publication Data

US 2015/0020039 A1    Jan. 15, 2015

Related U.S. Application Data

(62) Division of application No. 12/766,972, filed on Apr. 26, 2010, now Pat. No. 8,847,321.

(60) Provisional application No. 61/310,853, filed on Mar. 5, 2010.

(51) Int. Cl.
*G06F 17/50* (2006.01)
*H01L 27/088* (2006.01)
*H01L 27/092* (2006.01)

(52) U.S. Cl.
CPC ........ *G06F 17/5068* (2013.01); *G06F 17/50* (2013.01); *G06F 17/5009* (2013.01); *H01L 27/088* (2013.01); *H01L 27/0922* (2013.01)

(58) Field of Classification Search
USPC .......................................................... 716/55
See application file for complete search history.

(56) References Cited

U.S. PATENT DOCUMENTS

| | | | |
|---|---|---|---|
| 4,600,933 A | | 7/1986 | Richman |
| 5,245,543 A | * | 9/1993 | Smayling ............ G06F 17/5063 703/13 |
| 5,789,791 A | | 8/1998 | Bergemont |
| 6,611,025 B2 | | 8/2003 | Lin |
| 7,274,075 B2 | | 9/2007 | Yaegashi |

(Continued)

FOREIGN PATENT DOCUMENTS

CN    101431078 A    5/2009

OTHER PUBLICATIONS

Kwok, N., Complete Guide to Semiconductor Devices, 2002, John Wiley & Sons, Second Edition, pp. 175-177.

(Continued)

*Primary Examiner* — Eric Lee
(74) *Attorney, Agent, or Firm* — Duane Morris LLP

(57) ABSTRACT

A MOS device includes an active area having first and second contacts. First and second gates are disposed between the first and second contacts. The first gate is disposed adjacent to the first contact and has a third contact. The second gate is disposed adjacent to the second contact and has a fourth contact coupled to the third contact. A transistor defined by the active area and the first gate has a first threshold voltage, and a transistor defined by the active area and the second gate has a second threshold voltage.

19 Claims, 5 Drawing Sheets

(56) References Cited

U.S. PATENT DOCUMENTS

| | | |
|---|---|---|
| 7,750,417 B2 | 7/2010 | Iino et al. |
| 7,802,217 B1 * | 9/2010 | Gopinath et al. ............. 716/109 |
| 7,928,809 B2 | 4/2011 | Miyashita |
| 8,029,873 B2 | 10/2011 | Ikeda et al. |
| 2005/0189595 A1 | 9/2005 | Okamoto et al. |
| 2007/0118825 A1 * | 5/2007 | Gaul .............................. 716/10 |
| 2008/0121997 A1 | 5/2008 | Yang et al. |
| 2009/0114971 A1 | 5/2009 | Cai et al. |
| 2009/0212854 A1 * | 8/2009 | Baumgartner ................ 327/543 |

OTHER PUBLICATIONS

Sze, S.M., Physics of Semiconductor Devices, 1981, John Wiley & Sons, Second Edition, pp. 366-371.

\* cited by examiner

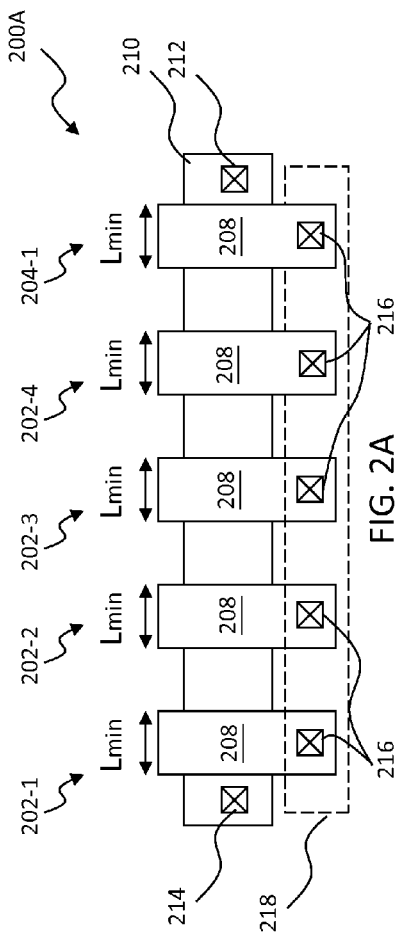
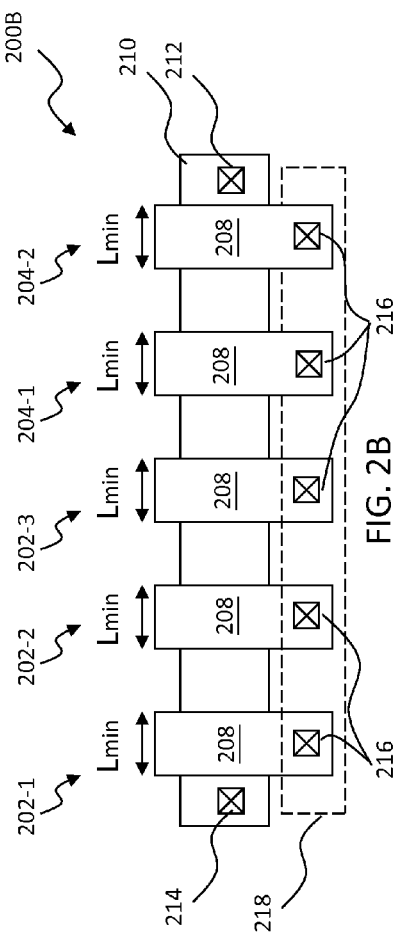

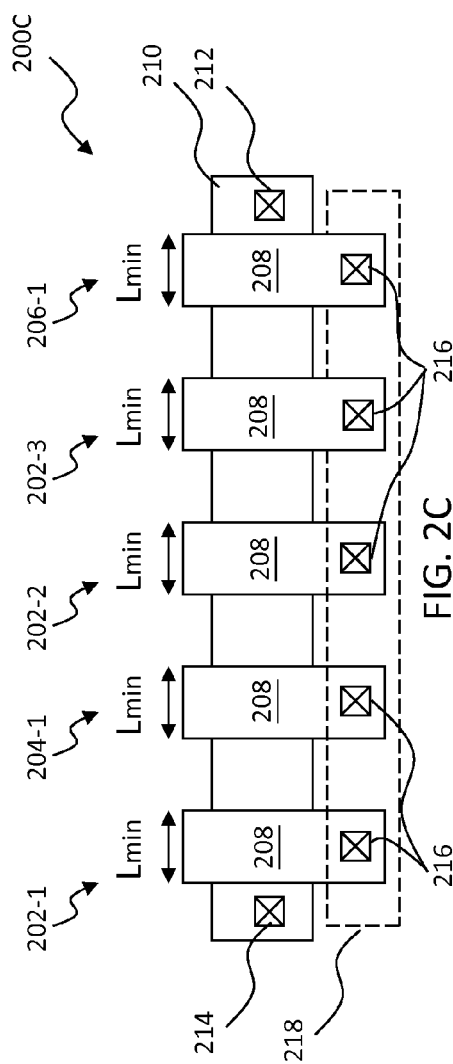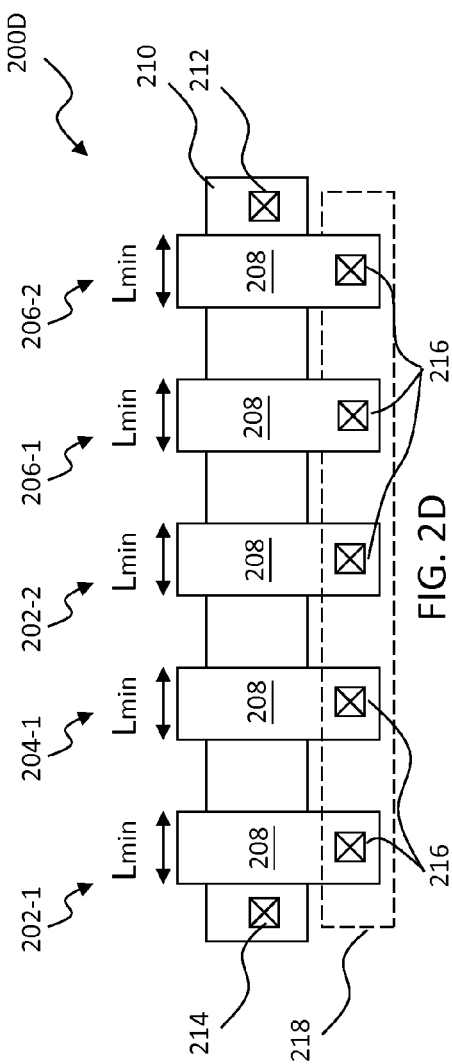

US 9,607,121 B2

CASCODE CMOS STRUCTURE

CROSS-REFERENCE TO RELATED APPLICATIONS

This application is a divisional of U.S. patent application Ser. No. 12/766,972, filed Apr. 26, 2010, now U.S. Pat. No. 8,847,321, which issued on Sep. 30, 2014 and claims priority to U.S. Provisional Patent Application No. 61/310,853 filed Mar. 5, 2010, the entireties of which are incorporated by reference herein.

FIELD OF DISCLOSURE

The disclosed system and method relate to integrated circuits. More specifically, the disclosed system and method relate to integrated circuit devices having large gate widths formed using complementary metal oxide semiconductor (CMOS) technology.

BACKGROUND

In accordance with the International Technology Roadmap for Semiconductors (ITRS), technology nodes below 40 nm have fixed polysilicon (poly) patterns having fixed pitches or uni-direction poly patterns for the manufacturing of metal oxide semiconductor (MOS) devices. These fixed poly pitch patterns for technology nodes smaller than 40 nm preclude large continuous lengths of poly. This restraint on large poly width dimensions is problematic in many analog circuits based on MOS devices, which require large gate-source resistances for providing large gains.

Accordingly, an improved design for MOS devices is desirable.

SUMMARY

A MOS device is disclosed that includes an active area having first and second contacts. First and second gates are disposed between the first and second contacts. The first gate is disposed adjacent to the first contact and has a third contact. The second gate is disposed adjacent to the second contact and has a fourth contact coupled to the third contact. A transistor defined by the active area and the first gate has a first threshold voltage, and a transistor defined by the active area and the second gate has a second threshold voltage.

A method is also disclosed in which an initial model of a MOS device is provided. The MOS device includes a gate having a gate contact disposed over an active area including first and second contacts. A final model of the MOS device is created based on the initial model such that in the final model the gate of the MOS device includes a plurality of fingers each having a respective gate contact. Each of the fingers respectively defines a transistor with the active area. A first one of the transistors has a first threshold voltage, and a second one of the transistors has a second threshold voltage. The final model of the MOS device is stored in a computer readable storage medium.

BRIEF DESCRIPTION OF THE DRAWINGS

FIGS. 2A-2D are layout views of improved MOS devices including a plurality of fingers.

DETAILED DESCRIPTION

The improved method and layout of MOS devices disclosed herein enables the fabrication of MOS devices having gate lengths exceeding a maximum allowed pitch pattern to be fabricated while maintaining consistent operating characteristics.

Figure 1A:
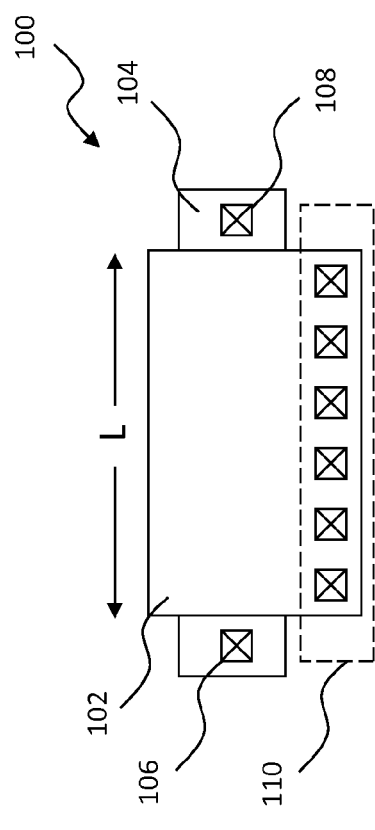
FIG. 1A is a layout view of a conventional MOS device.
Figure 1B:
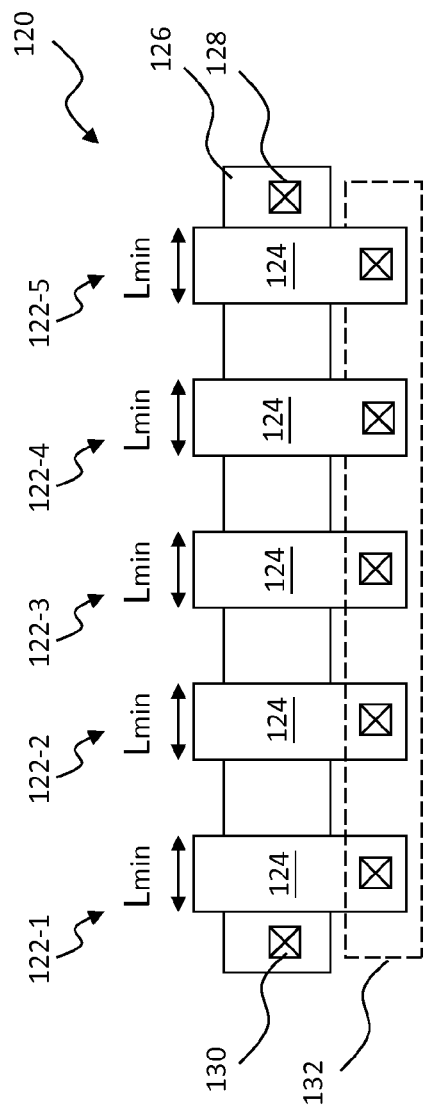
FIG. 1B is a layout view of an equivalent MOS device including a plurality of fingers.

FIG. 1A illustrates a MOS device 100 including a gate 102 having a length, L, formed over an active area 104. Contact 106 may be a drain contact, contact 108 may be a source contact, and contacts 110 are coupled together to form a gate contact for connecting to other devices. Conventionally, if the gate length of MOS device 100 exceeds a maximum pitch length as set forth by the ITRS for a certain technology node, e.g., a 1 μm gate length for 28 nm technology, then the MOS device is fabricated using a plurality of fingers, e.g., 10 fingers each having a gate length of 100 nm. FIG. 1B illustrates a MOS device 120 having five fingers 122-1:122-5 (collectively referred to as "fingers 122") coupled in a cascode, which have a total gate length that is equal to the gate length, L, of MOS device 100. Each of the fingers 122 includes a gate 124 having a length, $L_{min}$, which is an equal fraction of the length, L, of gate 102, e.g., $L_{min}$ is equal to L/5. Gates 124 are formed over active area 126 having a first contact 128 at one end and a second contact 130 at the other end. Contacts 132 are gate contacts, which may be coupled together and to other devices for turning on and off each of the fingers 122. Each of the gates 124 defines a transistor in combination with the active area 126 and the first and second contacts 128, 130, which may be a source contact and a drain contact, respectively. Each of the transistors is formed such that they each have the same threshold voltage.

However, fingers 122 may not turn on and off at the same time due to variations across the MOS device 120, which may cause detrimental performance in the circuit in which the MOS device 120 is incorporated. For example, assuming the voltage at contact 130 is greater than the voltage at contact 128, e.g., $V_s > V_d$, then the source voltage of finger 122-1 is greater than the source voltage of finger 122-2, which has a greater source voltage than finger 122-3, and so on such that finger 122-5 has the highest source voltage and finger 122-1 has the lowest source voltage. The variations in source voltages across MOS device 120 is due to the voltage drop across each of the gates 124 and results in finger 122-1 having a higher incidence of drain-to-source breakdown.

FIG. 2A-2D illustrate various embodiments of an improved layout of a MOS device 200. MOS device 200 in FIG. 2A includes a plurality of fingers 202-1:202-4 and 204-1 (collectively referred to as "fingers 202, 204") having a gate 208 formed over active area 210. Contacts 212 and 214 may be source and drain contacts of MOS device 200, respectively, although one skilled in the art will understand that contact 212 may be the drain contact and contact 214 may be the source contact. Contacts 216 of fingers 202, 204 are tied together by a conductive later 218 and collectively form the gate contact of MOS device 200.

Unlike MOS devices fabricated from a plurality of fingers in which each of the fingers has the same threshold voltages, $V_{th}$, MOS device 200A includes fingers 202, 204 having differing threshold voltages. For example, fingers 202 may have a first threshold voltage, $V_{th\text{-}202}$, and finger 204-1 may have a second threshold voltage, $V_{th\text{-}204}$, which is lower than the threshold voltage $V_{th202}$, if contact 214 is the source contact. The threshold voltage of any of fingers 202, 204 may be adjusted by varying the doping concentration of the channel beneath the gates of the fingers. For example, the channel in active area 210 may have higher doping concentrations beneath the gates 208 of fingers 202, and a lower doping concentration beneath the gates 208 of finger 204. Additionally or alternatively, the gate oxide thickness of fingers 202, 204 may be adjusted to vary the threshold voltages. Implementing MOS device 200A with a plurality of fingers 202, 204 with different threshold voltages, $V_{th\text{-}202}$, $V_{th\text{-}204}$ advantageously reduces the drain-to-source breakdown of the fingers 202, 204.

The number of fingers and threshold voltages of each of the fingers in a MOS device may be varied. For example, FIG. 2B illustrates an embodiment in which MOS device 200B includes three fingers 202-1:202-3 having one threshold voltage, $V_{th\text{-}202}$, and two fingers 204-1, 204-2 having another threshold, $V_{th\text{-}204}$. Fingers 204-1, 204-2 may be disposed adjacent to drain contact 212 and have a lower threshold voltage than transistors 204-1:204-3. FIG. 2C illustrates another embodiment in which MOS device 200C includes three fingers 202-1:202-3 having a first threshold voltage, $V_{th\text{-}202}$, one finger 204-1 having a second threshold voltage, $V_{th\text{-}204}$, 204, and another finger 206-1 having a third threshold voltage, $V_{th\text{-}206}$. Threshold voltage $V_{th\text{-}202}$ may be greater than threshold voltage $V_{th\text{-}204}$, which may be greater than threshold voltage $V_{th\text{-}206}$. FIG. 2D illustrates another embodiment in which MOS device 200D includes five fingers with two fingers 202-1, 202-2 having a first voltage threshold, $V_{th\text{-}202}$, one finger 204-1 having a second voltage threshold, $V_{th\text{-}204}$, and two fingers 206-1, 206-2 having a third voltage threshold, $V_{th\text{-}206}$. One skilled in the art will understand that the number of fingers and number of threshold voltages are not limited.

Figure 3:
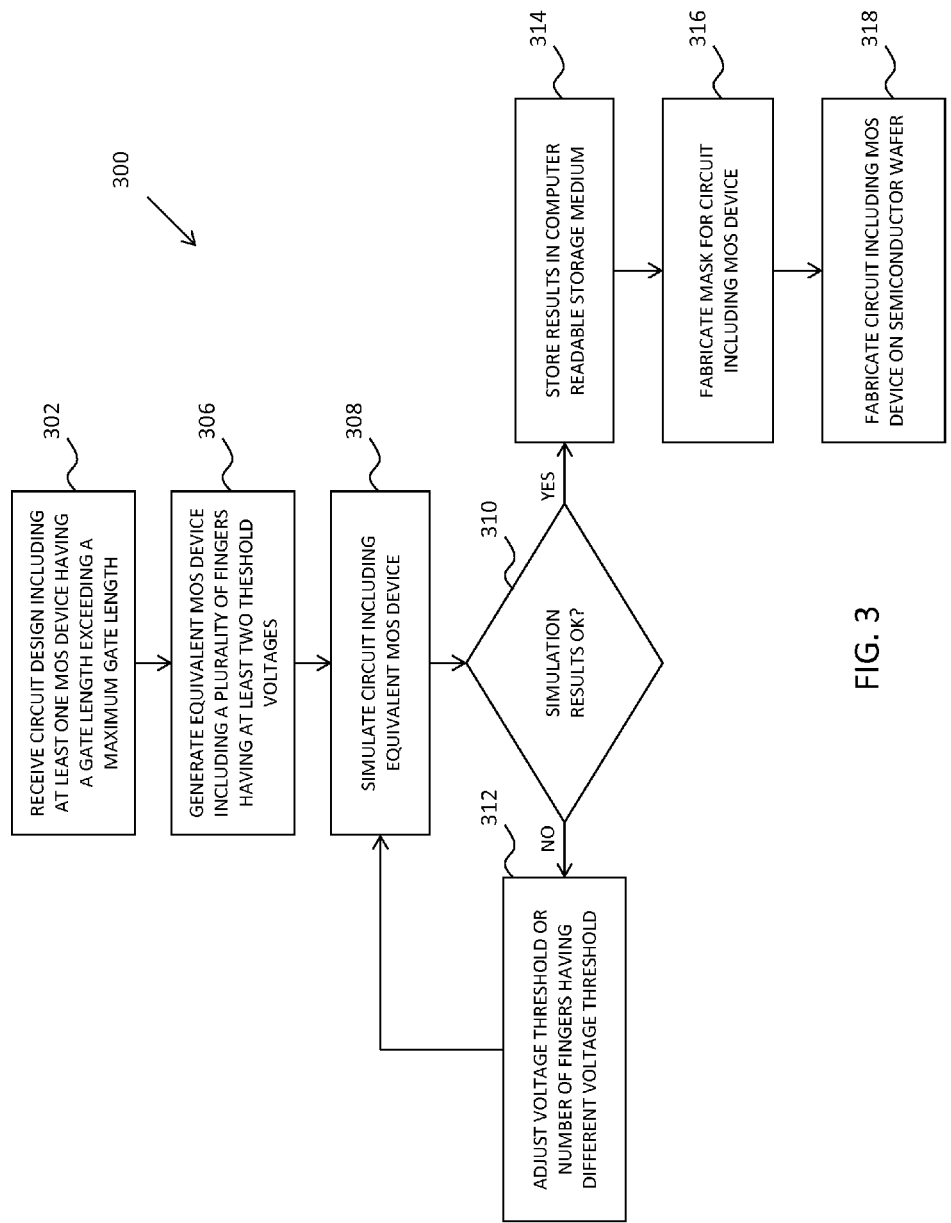
FIG. 3 is a flow diagram of one example of a method of designing an improved multi-finger MOS device.

The design and fabrication of the improved MOS device is described with reference to FIG. 3. As shown in FIG. 3, a circuit design including at least one MOS device having a gate length that exceeds a maximum poly pattern pitch of a technology node is received at block 302. At block 304, the MOS device having gate length, L, is divided into a plurality of fingers each having a gate length, $L_{min}$, and at least two threshold voltages. As described above, each of the fingers may have a gate length, $L_{min}$, that is an equal fraction of the gate length, L. For example, if gate length, L, of the MOS device is 1 μm, then the MOS device may be divided into 10 fingers each having a gate length, $L_{min}$, equal to 100 nm for a 28 nm technology node.

Figure 4:
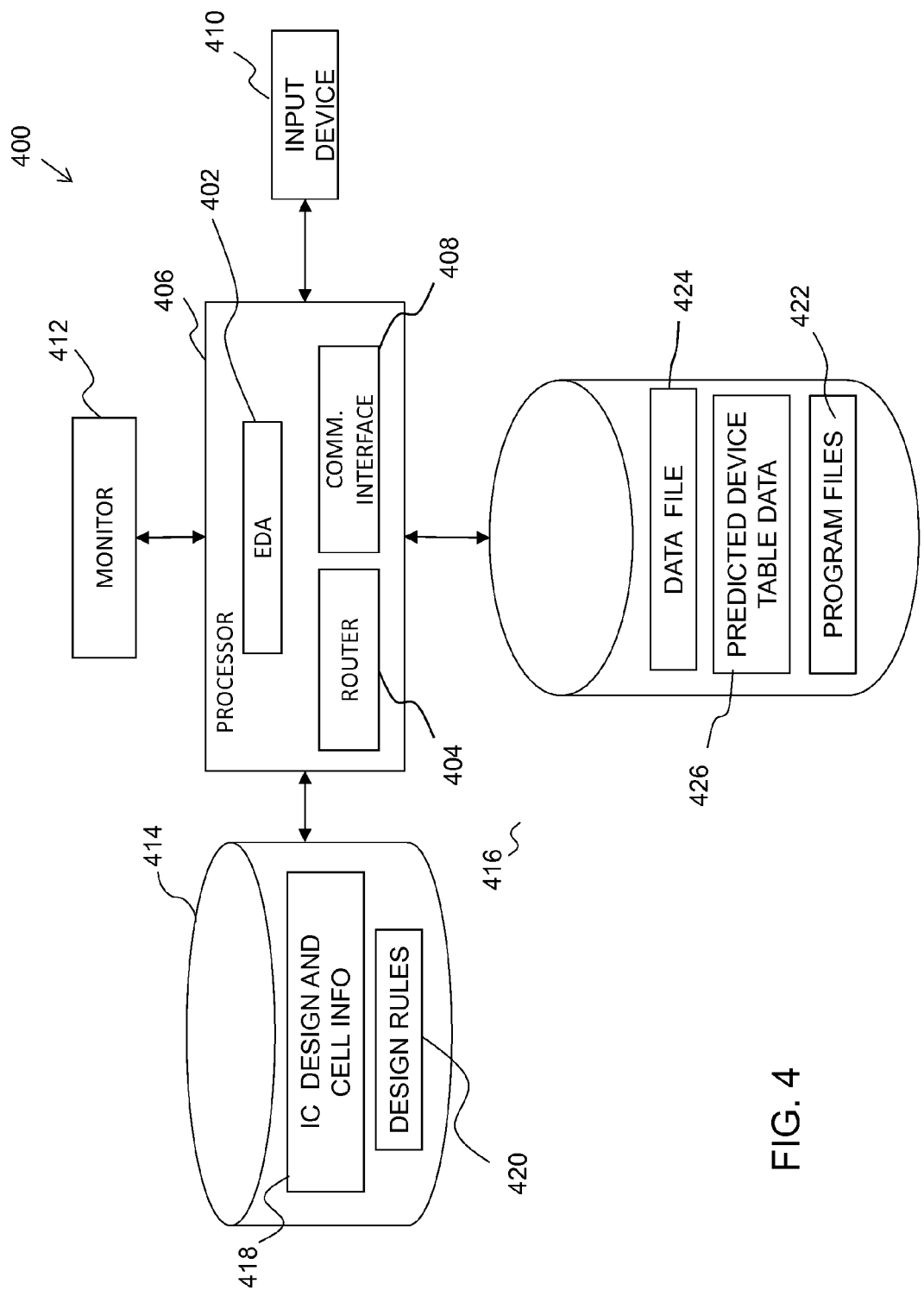
FIG. 4 is a block diagram of one example of a system for simulating an improved multi-finger MOS device.

A simulation of the circuit including the MOS device having a plurality of fingers is performed at block 306. The simulation may be performed using a simulation program with integrated circuit emphasis (SPICE) that may be run on a system 400 as illustrated in FIG. 4. As shown in FIG. 4, the system 400 may include an electronic design automation tool 402 such as "IC COMPILER"™, sold by Synopsis, Inc. of Mountain View, Calif., having a router 404 such as "ZROUTE"™, also sold by Synopsis. Other EDA tools 402 may be used, such as, for example, the "VIRTUOSO" custom design platform or the Cadence "ENCOUNTER"® digital IC design platform along with the "VIRTUOSO" chip assembly router 404, all sold by Cadence Design Systems, Inc. of San Jose, Calif.

The EDA tool 402 is a special purpose computer formed by retrieving stored program instructions 422 from a computer readable storage mediums 414, 416 and executing the instructions on a general purpose processor 406. Processor 406 may be any central processing unit (CPU), microprocessor, micro-controller, or computational device or circuit for executing instructions. Processor 606 may be configured to perform circuit simulations based on a plurality of data stored in the one or more computer readable storage mediums 414, 416.

The computer readable storage medium 414, 416 may include one or more of registers, a random access memory (RAM) and/or a more persistent memory, such as a ROM. Examples of RAM include, but are not limited to, SRAM or dynamic random-access memory (DRAM). A ROM may be implemented as a programmable read-only memory (PROM), an erasable programmable read-only memory (EPROM), an electrically erasable programmable read-only memory (EEPROM), magnetic or optical storage media, as will be understood by one skilled in the art.

System 400 may include a monitor 410 and a user interface or input device 412 such as, for example, a mouse, a touch screen, a microphone, a trackball, a keyboard, or like device through which a user may input design instructions and/or data. The one or more computer readable storage mediums 414, 416 may store data input by a user, design rules 420, IC design and cell information 418, and data files 426, such as GDSII files, representing a physical layout of a circuit. Computer readable storage mediums 414, 416 may also store various transistor models in a variety of formats including, but not limited to, BSIM3, BSIM4, PSP, and HiSIM to name a few.

EDA tool 402 may include a communication interface 408 allowing software and data to be transferred between EDA tool 402 and external devices. Example communications interfaces 408 include, but are not limited to, modems, Ethernet cards, wireless network cards, Personal Computer Memory Card International Association (PCMCIA) slots and cards, or the like. Software and data transferred via communications interface 408 may be in the form of signals, which may be electronic, electromagnetic, optical, or the like that are capable of being received by communications interface 408. These signals may be provided to communications interface 408 via a communication path (e.g., channel), which may be implemented using wire, cable, fiber optics, a telephone line, a cellular link, a radio frequency (RF) link, to name a few.

The router 404 is capable of receiving an identification of a plurality of circuit components to be included in an integrated circuit (IC) layout including a list of pairs of cells, macro blocks or I/O pads within the plurality of circuit components to be connected to each other. A set of design rules 420 may be used for a variety of technology nodes (e.g., technology greater than, less than, or equal to 40 nm). In some embodiments, the design rules 420 configure the router 404 to locate connecting lines and vias on a manufacturing grid. One or more plots of data may be displayed to a user of the system 400 on a monitor 412.

At decision block 310, the results of the simulation are reviewed to determine if the MOS device including the plurality of fingers performs suitably. For example, the simulation results may identify the breakdown voltages of each of the plurality of fingers of the MOS device. If the simulation results are not suitable, then the method proceeds to block 312 where the threshold voltage of one or more of the fingers of the MOS device is adjusted. The circuit is simulated again at block 308. One of ordinary skill in the art will appreciate that the loop including steps 308, 310, and 312 may be executed any number of times, until a desired operation of each of the fingers of the MOS device is achieved. This iteration can be performed by a computer repeatedly determining the breakdown voltages of each of the fingers of the MOS device for a plurality of different transistor adjustments, so that an acceptable multi-finger MOS device can be achieved on a first iteration on actual silicon.

If the simulation of the circuit including the MOS device indicates the configuration is acceptable, then the results of the simulation and/or parameters of the circuit including the MOS device are stored in a computer readable storage medium at block 314. At block 316, the masks for the circuit including the multi-finger MOS device are developed. The circuit including the multi-finger MOS device may then be fabricated at block 318.

In other examples, following generation of a mask set and fabrication of a substrate including the MOS device, additional adjustments can be made using the method of FIG. 3, by inputting the design used in silicon as the input design in FIG. 3.

The present invention may include one or more components in the form of computer-implemented processes and apparatus for practicing those processes. These components may also be embodied in the form of computer program code embodied in tangible machine readable storage media, such as random access memory (RAM), floppy diskettes, read only memories (ROMs), CD-ROMs, hard disk drives, flash memories, or any other machine-readable storage medium, wherein, when the computer program code is loaded into and executed by a computer, the computer becomes an apparatus for practicing the invention. These components may also be embodied in the form of computer program code loaded into and/or executed by a computer, such that, when the computer program code is loaded into and executed by a computer, the computer becomes an apparatus for practicing the invention. When implemented on a general-purpose processor, the computer program code segments configure the processor to create specific logic circuits. The components may alternatively be embodied in a digital signal processor formed of application specific integrated circuits for performing a method according to the principles described herein.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention. Delimiters used in the claims—such as 'a)' and 'i)'—should not be taken as imputing any order to the claims, but rather are provided only to serve as visual cues to add in the parsing of the claims and as identifiers in the event that a particular portion of the claim is to be later referenced.

What is claimed is:

1. A method, comprising:
a) creating an intermediate model of a MOS device based on an initial model such that the intermediate model of the MOS device includes an active area having first and second contacts, a gate including a gate contact disposed over the active area, and a plurality of fingers each having a respective gate contact, each of the fingers having equal gate lengths as one another, each finger respectively defining a transistor with the active area, a first subset of the transistors having a first threshold voltage and a second subset of the transistors having a second threshold voltage, each of the transistors having a respective breakdown voltage;
b) simulating a circuit including the intermediate model of the MOS device to determine whether each of the breakdown voltages satisfies a predetermined criterion;
c) in response to the determination, adjusting a number of transistors in at least one of the first and second subsets;
d) repeating steps b) and c) until each of the breakdown voltages satisfies the predetermined criterion; and
e) after determining that each of the breakdown voltages satisfies the predetermined criterion, storing the intermediate model of the MOS device as a final model of the MOS device in a computer readable storage medium,
wherein at least one mask for a photo process is fabricated based on the final model of the MOS device.

2. The method of claim 1, further comprising:
f) fabricating the mask for the photo process based on the final model of the MOS device; and
g) fabricating the MOS device on a semiconductor wafer using the mask.

3. The method of claim 1, wherein
the first contact is a source contact and the second contact is a drain contact,
a gate of the first one of the transistors is disposed adjacent to the first contact,
a gate of the second one of the transistors is disposed adjacent to the second contact, and
the first threshold voltage is less than the second threshold voltage.

4. The method of claim 3, wherein
the final model of the MOS device including a third one of the transistors having a third gate disposed between the gate of the first one of the transistors and the gate of the second one of the transistors,
the third one of the transistors having a third threshold voltage that is greater than the first threshold voltage.

5. The method of claim 4, wherein the third threshold voltage is less than the second.

6. A method, comprising:
a) creating an intermediate model of a MOS device based on an initial model of the MOS device such that the intermediate model of the MOS device includes a first subset of a plurality of fingers having a first threshold voltage that is different from a second threshold voltage of a second subset of the plurality of fingers, wherein the first and second subsets of fingers have equal gate lengths, and wherein each of the fingers has a respective breakdown voltage;
b) simulating a circuit including the intermediate model of the MOS device to determine whether each of the breakdown voltages satisfies a predetermined criterion;
c) in response to the determination, adjusting a number of fingers in at least one of the first and second subsets;
d) repeating steps b) and c) until each of the breakdown voltages satisfies the predetermined criterion; and
e) after determining that each of the breakdown voltages satisfies the predetermined criterion, storing the intermediate model of the MOS device as a final model of the MOS device in a computer readable storage medium,
wherein at least one mask for a photo process is fabricated based on the final model of the MOS device.

7. The method of claim 6, further comprising
f) fabricating the mask for the photo process based on the final model of the MOS device; and
g) fabricating the MOS device on a semiconductor wafer using the mask.

8. The method of claim 6, wherein the first threshold voltage in the final model is provided by a first gate oxide thickness, and the second threshold voltage in the final model is provided by a second gate oxide thickness that is different from the first gate oxide thickness.

9. The method of claim 6, wherein the first threshold voltage in the final model is provided by a first portion of the active area disposed beneath the first finger having a first doping concentration, and the second threshold voltage in the final model is provided by a second portion of the active area disposed beneath the second finger having a second doping concentration that is different from the from first doping concentration.

10. The method of claim 6, wherein
the first contact is a source contact and the second contact is a drain contact,
a gate of the first finger of the plurality of fingers is disposed adjacent to the first contact,
a gate of the second finger of the plurality of fingers is disposed adjacent to the second contact, and
the first threshold voltage is less than the second threshold voltage.

11. The method of claim 10, further comprising a third subset of the plurality of fingers disposed between the first and second subsets of fingers, the third subset of fingers having a third threshold voltage that is different from the first threshold voltage and the second threshold voltage.

12. The method of claim 6, further comprising:
d) fabricating the mask for the photo process based on the final model of the MOS device; and
e) fabricating the MOS device on a semiconductor wafer using the mask.

13. The method of claim 6, wherein the first threshold voltage is adjusted by changing a doping concentration of a first portion of the active area disposed beneath the first finger.

14. The method of claim 6, wherein the first threshold voltage is adjusted by changing an oxide thickness beneath the first finger.

15. The method of claim 6, wherein each of the plurality of fingers are coupled together and collectively form a gate of the MOS device.

16. A method, comprising:
a) creating an intermediate model of a MOS device based on an initial model of the MOS device such that in the intermediate model of the MOS device a first subset of a plurality of fingers has a first threshold voltage that is different from a second threshold voltage of a second subset of the plurality of fingers, wherein the first and second subsets of fingers have equal gate lengths, and wherein each of the fingers has a respective breakdown voltage;
b) simulating a circuit including the intermediate model of the MOS device to determine each of the breakdown voltages satisfies a predetermined criterion;
c) in response to the determination, adjusting a number of fingers in at least one of the first and second subsets;
d) repeating steps b) and c) until each of the breakdown voltages satisfies the predetermined criterion; and
e) after determining that each of the breakdown voltages satisfies the predetermined criterion, storing the intermediate model of the MOS device as a final model of the MOS device in a computer readable storage medium;
f) creating a mask for a photo process based on the final model of the MOS device; and
g) fabricating the MOS device on a semiconductor wafer using the mask.

17. The method of claim 16, wherein the first threshold voltage is adjusted by changing a doping concentration of a first portion of the active area disposed beneath the first finger.

18. The method of claim 16, wherein the first threshold voltage is adjusted by changing an oxide thickness beneath the first finger.

19. The method of claim 16, wherein each of the plurality of fingers are coupled together and collectively form a gate of the MOS device.

* * * * *